United States Patent
Boy et al.

(10) Patent No.: US 10,833,248 B2
(45) Date of Patent: Nov. 10, 2020

(54) METHOD FOR PREPARING A SOL-GEL SOLUTION WHICH CAN BE USED FOR PREPARING A BARIUM TITANATE CERAMIC DOPED WITH HAFNIUM AND/OR WITH AT LEAST ONE LANTHANIDE ELEMENT

(71) Applicant: COMMISSARIAT A L'ENERGIE ATOMIQUE ET AUX ENERGIES ALTERNATIVES, Paris (FR)

(72) Inventors: Philippe Boy, Joué-lès-Tours (FR); Thomas Richardot, Vitry sur Seine (FR); Philippe Belleville, Tours (FR)

(73) Assignee: Commissariat a L'Energie Atomique et aux Energies Alternatives, Paris (FR)

( * ) Notice: Subject to any disclaimer, the term of this patent is extended or adjusted under 35 U.S.C. 154(b) by 211 days.

(21) Appl. No.: 16/062,459

(22) PCT Filed: Dec. 15, 2016

(86) PCT No.: PCT/EP2016/081136
§ 371 (c)(1),
(2) Date: Jun. 14, 2018

(87) PCT Pub. No.: WO2017/102919
PCT Pub. Date: Jun. 22, 2017

(65) Prior Publication Data
US 2019/0006579 A1 Jan. 3, 2019

(30) Foreign Application Priority Data
Dec. 15, 2015 (FR) ..................... 15 62398

(51) Int. Cl.
| | | |
|---|---|---|
| *C04B 35/624* | (2006.01) | |
| *C04B 35/468* | (2006.01) | |
| *C04B 35/622* | (2006.01) | |
| *H01L 41/318* | (2013.01) | |
| *C01G 23/00* | (2006.01) | |
| *H01L 41/187* | (2006.01) | |
| *C01G 27/00* | (2006.01) | |
| *H01L 41/08* | (2006.01) | |

(52) U.S. Cl.
CPC .......... *H01L 41/318* (2013.01); *C01G 23/006* (2013.01); *C01G 27/006* (2013.01); *C04B 35/4682* (2013.01); *C04B 35/624* (2013.01); *H01L 41/081* (2013.01); *H01L 41/1871* (2013.01); *C04B 35/62218* (2013.01); *C04B 35/62222* (2013.01); *C04B 2235/3244* (2013.01); *C04B 2235/3249* (2013.01); *C04B 2235/441* (2013.01); *C04B 2235/449* (2013.01); *C04B 2235/656* (2013.01); *C04B 2235/74* (2013.01); *C04B 2235/80* (2013.01); *C04B 2235/94* (2013.01)

(58) Field of Classification Search
CPC .............. C04B 35/624; C04B 35/4682; C04B 2235/3215; C04B 2235/3224–3229; C04B 2235/3232; C04B 2235/449; C04B 2235/441
See application file for complete search history.

(56) References Cited

U.S. PATENT DOCUMENTS

| | | | | |
|---|---|---|---|---|
| 4,886,654 A * | 12/1989 | Ohga | ................... | C01G 23/006 423/598 |
| 5,645,634 A * | 7/1997 | Ogi | ..................... | C23C 18/1216 106/287.19 |
| 6,180,252 B1 * | 1/2001 | Farrell | ................... | C23C 18/08 428/469 |
| 6,432,472 B1 | 8/2002 | Farrell et al. | | |
| 7,187,024 B2 * | 3/2007 | Kobayashi | ........... | B41J 2/14233 257/295 |
| 2002/0195612 A1 * | 12/2002 | Farrell | ................ | H01G 4/1227 257/103 |
| 2003/0128496 A1 * | 7/2003 | Allen | ....................... | H01G 4/06 361/306.3 |

(Continued)

FOREIGN PATENT DOCUMENTS

| | | |
|---|---|---|
| EP | 1 449 817 A1 | 8/2004 |
| EP | 1 777 713 A2 | 4/2007 |
| JP | 01100024 A * | 4/1989 |

OTHER PUBLICATIONS

Chewasatn et al. Sol-gel Synthesis of Crack-Free Thin Films of Calcium Lead Titanate. ISAF '96. Proceedings of the Tenth IEEE International Symposium on Applications of Ferroelectrics, East Brunswick, NJ, USA, 1996, pp. 597-600, vol. 2. (Year: 1996).*

(Continued)

*Primary Examiner* — Erin Snelting
(74) *Attorney, Agent, or Firm* — Alston & Bird LLP

(57) ABSTRACT

The invention relates to a method for preparing a sol-gel solution which can be used to prepare a barium titanate ceramic doped with hafnium and/or with at least one lanthanide element, comprising the following steps:

a) a step to place a first mixture comprising a barium carboxylate and a diol solvent in contact with a second mixture comprising a titanium alkoxide and a hafnium alkoxide and/or an alkoxide of a lanthanide element in a monoalcohol solvent;

b) a step to distil the mixture resulting from step a) to remove at least part of the monoalcohol solvent;

c) a step to add acetic acid, under heat, to the distilled mixture of step b).

16 Claims, No Drawings

(56) References Cited

U.S. PATENT DOCUMENTS

| | | | |
|---|---|---|---|
| 2003/0128497 A1* | 7/2003 | Allen | H01G 4/06 361/306.3 |
| 2004/0014820 A1* | 1/2004 | Belleville | C01G 23/003 516/33 |
| 2005/0255239 A1* | 11/2005 | Zhu | B82Y 30/00 427/226 |
| 2006/0022304 A1* | 2/2006 | Rzeznik | H01G 4/08 257/532 |
| 2006/0121258 A1 | 6/2006 | Kim et al. | |
| 2007/0131142 A1* | 6/2007 | Borland | H01L 21/02205 106/287.19 |
| 2008/0090006 A1* | 4/2008 | Yoshinaka | C09D 1/00 427/212 |
| 2008/0171140 A1* | 7/2008 | Hirmer | C23C 18/1216 427/100 |
| 2008/0175985 A1* | 7/2008 | Belleville | C04B 35/472 427/126.3 |
| 2008/0182128 A1* | 7/2008 | Boy | H01L 41/0815 428/697 |
| 2008/0292790 A1* | 11/2008 | Lebrette | C23C 18/1208 427/226 |
| 2009/0135546 A1 | 5/2009 | Wang et al. | |
| 2009/0297804 A1* | 12/2009 | Paul | C01G 23/006 428/210 |
| 2013/0168597 A1* | 7/2013 | Houbertz-Krauss | C04B 35/468 252/62.9 PZ |
| 2015/0280103 A1* | 10/2015 | Kobayashi | B41J 2/161 347/68 |
| 2016/0214902 A1* | 7/2016 | Schwarz | C04B 35/62259 |
| 2017/0152186 A1* | 6/2017 | Cimmino | C04B 35/4682 |
| 2017/0236994 A1* | 8/2017 | Cimmino | C04B 35/465 252/62.9 PZ |

OTHER PUBLICATIONS

Garcia-Hernandez et al. Eu-Doped BaTiO3 Powder and Film from Sol-Gel Process with Polyvinylpyrrolidone Additive. International Journal of Molecular Sciences, 2009, vol. 10, pp. 4088-4101. (Year: 2009).*

* cited by examiner

METHOD FOR PREPARING A SOL-GEL SOLUTION WHICH CAN BE USED FOR PREPARING A BARIUM TITANATE CERAMIC DOPED WITH HAFNIUM AND/OR WITH AT LEAST ONE LANTHANIDE ELEMENT

CROSS-REFERENCE TO RELATED APPLICATIONS

This application is a national stage application filed under 35 U.S.C. § 371 of International Patent Application No. PCT/EP2016/081136, filed Dec. 15, 2016, which in turn claims priority of French Patent Application No. 1562398 filed Dec. 15, 2015, the disclosures of each of which are incorporated herein by reference in their entirety, for all purposes.

TECHNICAL FIELD

The subject of the present invention is a method for preparing a sol-gel solution which can be used to prepare a barium titanate ceramic doped with hafnium and/or with at least one lanthanide element (such as lanthanum, cerium, europium, gadolinium).

The sol-gel solutions of the invention obtained with the method of the invention can be used as base directly or indirectly to prepare different materials such as powders, compacted objects (e.g. pellets), coatings in the form of thin films, composite sol-gel solutions or thick coatings prepared from said composite sol-gel solutions.

The materials obtained from the sol-gel solutions of the invention may particularly have piezoelectric properties i.e. properties allowing the conversion of elastic strain energy to electric energy. More specifically, these materials have the capacity to polarise when mechanically stressed, the charge appearing on the surface thereof being proportional to the generated strain. Such materials can find applications in fields as varied as the design of piezoelectric lighters, transducers and actuators, ultrasound generators or receivers, or touch interfaces.

More specifically, they can find application in the design of transducers used in high resolution ultrasound probes for medical imaging.

STATE OF THE PRIOR ART

Ceramics of barium titanate type doped with hafnium have been the subject in the prior art of preparation methods using the sol-gel technique.

Conventionally, at a first stage of the sol-gel technique, a solution is prepared containing precursors of the ceramic it is desired to obtain (e.g. organometallic compounds, metallic salts) thereby forming a sol (also called a sol-gel solution). At a second stage, if it is desired to obtain a ceramic coating, the sol-gel solution is deposited in the form of a film on a substrate. In contact with ambient humidity the precursors hydrolyse and condense to form an oxide network trapping the solvent, leading to a gel. The film-forming gel layer is then heat treated to form a film in ceramic.

This process is notably investigated in document US 2007/0131142 describing a method to prepare thin films of barium titanate, part of the titanium atoms thereof being substituted by zirconium, tin or hafnium. For this purpose, a sol-gel solution is prepared from precursors of said above-mentioned elements, in acetic acid, in the presence of acetylacetonate and diethanolamine as complexing agents. Diethanolamine is a tridentate ligand having the capacity to react with acetic acid to form an ester or amino ester, the resulting ester or amino ester being able to complex the metal atoms together grouping them to form homogeneous clusters. However, it has been ascertained by the authors of the invention that the use of ethyl acetonate in this context reduces the effect of cluster formation and more particularly prevents the formation of clusters having a diameter larger than 2 nm.

In Fu et al., Int. J. of Materials Research, 103, 2012, 1400-1403, the preparation is also described of a ceramic of barium titanate type doped with hafnium, and more particularly of formula $BaHf_{0.1}Ti_{0.9}O_3$, also having recourse to acetylacetonate, in addition to precursors of the metallic elements, and at the end of synthesis, to polyethylene glycol. The polymer chains have the particular aspect of winding themselves around the metal ions so that they screen one another, this having the disadvantage however of representing a heavy organic load to be removed. Additionally, the concentration of the sol-gel solutions obtained with this method remains lower than 0.5 M.

In the light of the foregoing, the inventors have therefore set themselves the objective of developing a method for preparing a precursor sol-gel solution of a barium titanate ceramic doped with hafnium and/or at with least one lanthanide element, which provides access to molecular species of larger size and to a broad range of concentrations (in particular high concentrations, higher than 0.5 M), it then being possible to use said sol-gel solutions for the design of materials having good piezoelectric properties.

SUMMARY OF THE INVENTION

The invention therefore pertains to a method for preparing a sol-gel solution which can be used to prepare a barium titanate ceramic doped with hafnium and/or with at least one lanthanide element, comprising the following steps:

a) a step to place a first mixture comprising a barium carboxylate and diol solvent in contact with a second mixture comprising a titanium alkoxide and hafnium alkoxide and/or alkoxide of a lanthanide element in a monoalcohol solvent;

b) a step to distil the mixture resulting from step a), to remove at least part of the monoalcohol solvent;

c) a step to add acetic acid, under heat, to the distilled mixture of step b).

It is specified that by barium titanate doped with hafnium and/or with at least lanthanide element it is meant barium titanate having part of the titanium atoms substituted by hafnium and/or by at least one lanthanide element.

By developing an original method to prepare a sol-gel solution such as defined above, the authors have been able to evidence the formation of larger molecular species in the sol-gel solution (e.g. species having a diameter in the order of 2 to 5 nm, whereas they generally have a diameter of less than 2 nm in methods involving the use of acetylacetonate). With the method of the invention, it is also possible to access sol-gel solutions having a broad range of concentrations, in particular concentrations higher than 0.5 M and more specifically ranging from 0.5 M to 1 M, without being detrimental to the homogeneity of the solution at the end of the method, which could be attributed to the use of acetic acid, thereby preventing inter alia the precipitation of species in solution. It is to be noted that if the same amount of acetic acid is added before distillation this will lead to a phenomenon of precipitation after distillation, hence the importance of paying good heed to the time of addition of acetic acid."

Without being bound by any theory, the formation of these molecular species of larger diameter can be accounted for by the reaction of acetic acid with the diol solvent which will form esters, these forming bidentate complexing agents capable of randomly associating with the barium atoms and other atoms (here titanium, hafnium and/or the lanthanide element(s)), thereby promoting the growth of clusters in solution and stabilisation of the solution, said stabilisation also resulting from the voluminous nature of these complexing agents.

In other words, to ensure random distribution, the organic species must be voluminous so as to «screen» the metal atoms from each other and thereby prevent any phase separation at the time of oxide formation when treating the sol-gel solution. In the invention, the reaction mixture contains acetic acid, a monoalcohol solvent and a diol solvent. The advantage of the diol solvent is the bidentate nature therefore allowing bridges to be created between the precursors of barium, titanium, hafnium and/or lanthanide element. Without being bound by any theory, through the reaction with acetic acid, biacetates and also bidentates may be formed that complex with the metal atoms and allow better screening between them and thereby better homogenisation.

As mentioned above, the method of the invention comprises a step a) to place a first mixture comprising a barium carboxylate and diol solvent in contact with a second mixture comprising a titanium alkoxide and hafnium alkoxide and/or an alkoxide of a lanthanide element in a monoalcohol solvent, this contacting possibly being conducted under agitation.

Preferably, the sol-gel solution prepared according to the method of the invention is intended to be used to prepare a barium titanate ceramic solely doped with hafnium, in which case the second mixture comprises a titanium alkoxide and hafnium alkoxide in a monoalcohol solvent.

Barium carboxylate, as its name indicates, is a compound comprising barium complexed with ligands belonging to the category of carboxylate groups, this barium carboxylate possibly being represented by following formula (I):

$$(RCOO)_2Ba \qquad (I)$$

where R is an alkyl group having 1 to 3 carbon atoms.

More specifically, the barium carboxylate can be barium acetate of formula $(CH_3COO)_2Ba$.

Barium carboxylate is contained in a first mixture also comprising a diol solvent, this diol solvent advantageously being an alkylene glycol having a number of carbon atoms ranging from 2 to 5, and more specifically ethylene glycol.

The hafnium alkoxide and/or alkoxide of a lanthanide element and titanium alkoxide contained the second mixture may respectively meet following formulas (II) and (III):

$$X(OR)_4 \qquad (II)$$

$$Ti(OR)_4 \qquad (III)$$

where:
X is the hafnium element or lanthanide element;
R is a linear or branched alkyl group and more specifically a branched alkyl group having at least 3 carbon atoms, and more specifically 3 or 4 carbon atoms, said group possibly being the isopropyl group or isobutyl group.

More specifically, the hafnium alkoxide and titanium alkoxide may be hafnium isopropoxide and titanium isopropoxide.

These alkoxides are contained in the second mixture which additionally comprises a monoalcohol solvent and more specifically an aliphatic monoalcohol solvent possibly having 1 to 6 carbon atoms for example. As example of an aliphatic monoalcohol, mention can be made of isopropanol which is particularly suitable when the hafnium alkoxide and titanium alkoxide are hafnium isopropoxide and titanium isopropoxide.

In general, the monoalcohol solvent preferably comprises the same number of carbon atoms as each alkoxy ligand (RO) of the alkoxides of above-mentioned formulas (II) and (III), when alkoxides meeting these formulas are used.

Before implementing step a), the method of the invention may comprise a step to prepare the first mixture and a step to prepare the second mixture, these steps respectively being a step to place the barium carboxylate in contact with a diol solvent for the first mixture, and a step to place the titanium alkoxide and hafnium alkoxide and/or alkoxide of a lanthanide element in contact with a monoalcohol solvent for the second mixture.

More specifically and as an example, when the barium carboxylate is barium acetate, the diol solvent is ethylene glycol, the hafnium alkoxide is hafnium isopropoxide, the titanium alkoxide is titanium isopropoxide and the monoalcohol solvent is isopropanol, the step to place the first mixture in contact with the second mixture being performed under agitation for a time of about 1 hour, after which a white opaque solution is obtained.

After step a), the method of the invention comprises a step to distil the mixture resulting from step a), to remove at least part of the monoalcohol solvent and preferably to remove at least 90% of the entirety of the total volume of monoalcohol solvent (namely that derived from the starting second mixture and that resulting from decomposition of the precursors).

More specifically, at this distillation step, the mixture of step a) is heated to an adequate temperature to generate removal of at least part of the monoalcohol solvent.

In addition, this distillation step allows facilitated dissolution of hafnium alkoxide, when applicable, via a coordination change of hafnium at this step that is concomitantly accompanied by removal of part of the monoalcohol solvent, e.g. at least 90% thereof, to which is added the removal of part of the alcohol compounds derived from the hafnium-complexing alkoxy ligands.

Finally, the distillation step accelerates the formation of diol esters resulting from the reaction of the diol solvent with a carboxylate compound derived from the barium-complexing ligand, which promotes stabilisation of the solution through the bidentate and voluminous nature of the diol esters.

For example, when the barium carboxylate is barium acetate, the diol solvent is ethylene glycol, the hafnium alkoxide is hafnium isopropoxide, the titanium alkoxide is titanium isopropoxide and the monoalcohol solvent is isopropanol, the distillation step can be conducted at a temperature of up to 160° C., after which 90% of the isopropanol is removed (including that derived from the precursors) leading to the formation of glycol acetates (namely specific esters of ethylene glycol), promoting stabilisation of the solution.

After the distillation step, the method of the invention comprises a step to add acetic acid, under heat, to the distilled mixture of step b).

It is specified that by distilled mixture of step b) it is meant the mixture from which at least part of the monoalcohol solvent has been extracted, the extracted monoalcohol solvent forming the distillate.

By addition step under heat it is meant an addition step performed at a temperature higher than ambient temperature, and preferably of up to 100° C.

Therefore, for the implementation of this step conducted after the distillation step b), the distilled mixture can be left to cool down to a temperature higher than ambient temperature and preferably of up to 100° C.

The addition of acetic acid contributes towards the total dissolution of the precursors that have not yet dissolved, and more specifically of the barium precursor that is a barium carboxylate.

Without being bound by any theory, the acetic acid reacts with the diol solvent e.g. ethylene glycol, to form esters that will bind to the barium atoms, thereby generating more soluble species. Therefore, the addition of acetic acid also contributes towards solubilising the barium carboxylate such as barium acetate which conventionally arrives at saturation in ethylene glycol over and above 0.5 M. This allows the use of higher concentrations of barium carboxylate.

In addition, the formation of esters resulting from reaction of the solvent such as ethylene glycol with acetic acid, which are voluminous bidentate complexing agents, contributes towards the formation of molecular species of larger diameters (e.g. a diameter ranging from 2 to 5 nm) and to increased viscosity.

The method of the invention is particularly adapted for the preparation of precursor sol-gel solutions of oxide ceramics, meeting following formula (IV):

$$BaHf_xTi_{1-x}O_3 \qquad (IV)$$

where $0.05<x\leq0.5$, and more specifically where $0.05<x\leq0.2$.

The sol-gel solution obtained after step c) can be used directly, for example to produce powders, or it can be given subsequent use i.e. after storage during which the solution may undergo an ageing step in which case it may be advantageous, in the method of the invention, to dilute the sol-gel solution after an agitation step of this solution.

Therefore, in this case, the method of the invention after step c) successively comprises the following steps:

d) a step to agitate the sol-gel solution obtained at step c); and e) a step to dilute the sol-gel solution resulting from step d) in a predetermined ratio with the same diol solvent as used at step a).

This dilution step may entail diluting the sol-gel solution obtained after step d) by a dilution factor ranging from 1 to 20 with the same diol solvent as used at step a). This dilution step particularly provides control over the size of the clusters, in accordance with the desired use of the sol-gel solution.

The sol-gel solutions obtained with the method of the invention can be employed for the following:

to produce a ceramic material, for example in the form of thin films, via heat treatment of said sol-gel solution;

to produce powders of barium titanate doped with hafnium and/or with at least one lanthanide element, said powders then possibly being used to form compacted objects such as pellets;

to produce a composite sol-gel solution, namely a sol-gel solution obtained with the method of the invention, to which a powder is added, said sol-gel solution possibly being given subsequent use to produce thick coatings.

The invention therefore also relates to a method for preparing a material in barium titanate doped with hafnium and/or with at least one lanthanide element, said method comprising:

f) a step to implement the method for preparing a sol-gel solution such as defined above;

g) at least one step to deposit a layer of the sol-gel solution, obtained at step f), on a substrate;

h) a heat treatment step of said at least one layer, for conversion thereof to barium titanate doped with hafnium and/or with at least one lanthanide element.

Step g) therefore entails the depositing on a substrate of the stable sol-gel solution, prepared following the previously described method, in the form of a layer.

This deposition can be conducted using any technique allowing a deposit to be obtained in the form of thin layers. The thickness of each deposited thin layer, according to the invention, can range from 10 nm to 500 nm, preferably from 50 nm to 100 nm.

Deposition can be carried out using one of the following techniques:

dip-coating;
spin-coating;
laminar-flow-coating (or meniscus coating);
spray-coating;
soak coating;
roll-to-roll coating;
paint coating;
screen printing; and
ink-jet deposit.

However, preferably, deposition is carried out using the dip-coating technique or spin-coating technique. These techniques particularly facilitate precise control over the thickness of the deposited layers.

Regarding the spin-coating technique, the substrate to be coated is held in place on a rotating support. A volume of sol-gel solution is deposited allowing coverage of said substrate. Centrifugal force spreads said solution into a thin layer. The thickness of the layer is notably dependent on speed of centrifugation and concentration of the solution. Since the parameter for concentration of the solution is set, it is within easy reach of skilled persons to choose a desired centrifugation speed for a desired layer thickness.

In the invention, the substrate intended to be coated may be of various types, but preferably must not contaminate the deposited layer through ion migration for example at the time of heat treatment and must preferably allow good adhesion of the layer. The softening temperature thereof must advantageously be higher than the temperature of the heat treatments of the deposited layers, and its coefficient of heat expansion must advantageously be of the same order of magnitude as that of said layers to limit the effects of heat treatment stress.

In the invention, the substrate may be a silicon wafer optionally coated with a metallic layer. This type of substrate advantageously displays good planarity and excellent surface condition, and in particular allows heat treatments at high temperature without suffering deterioration.

This substrate may comprise a barrier layer on the side or sides to be used as deposition surface, the function of this barrier layer being to prevent migration of substrate atoms towards the deposited layer(s) obtained after heat treatment. A further function of this barrier layer is to reduce dielectric losses of the materials obtained with the method of the invention. The barrier layer is deposited before implementing step g).

Once the sol-gel solution has been deposited on a surface of the substrate optionally coated with a barrier layer, the method of the invention comprises a heat treatment step of the deposited layer(s) for conversion thereof to the desired ceramic. This heat treatment can be performed in several manners depending on whether or not the method comprises implementation of one or more deposition steps g) such as mentioned above.

In the method of the invention, when step g) is only implemented once, heat treatment in general may successively comprise the following operations:
- a drying operation of the layer, generally at a suitable temperature to obtain gelling thereof;
- a calcining operation, generally at a suitable temperature to obtain removal of the organic products included in the layer;
- an annealing operation, generally at a suitable temperature to obtain crystallization of the layer towards an oxide ceramic.

In the method of the invention when step g) is performed n times, n corresponding to the number of repeats of step g), n being an integer possibly ranging from 2 to 50, the heat treatment may comprise:
- for each of the (n−1) first deposited layers, a cycle of operations successively comprising:
  - a drying operation of each (n−1) deposited layer;
  - a calcining operation of each (n−1) deposited layer;
- for the $n^{th}$ deposited layer, a cycle of operations successively comprising:
  - a drying operation of said layer;
  - a calcining operation of said layer;
  - a pre-annealing operation of said layer;
- said heat treatment being finalised by an annealing operation of all said deposited layers (i.e. the n layers).

In other words, for the (n−1) first layers, each of said layers will successively undergo a drying operation, a calcining operation. Then the $n^{th}$ layer, deposited on the stack of the first (n−1) layers, will successively undergo a drying operation followed by a calcining operation and a pre-annealing operation. Finally, heat treatment will be finalised with an annealing operation of the whole stack.

Irrespective of the envisaged alternative, each deposited layer of solution according to the invention undergoes an operation to dry the deposited layer to ensure gelling of the layer. This operation is intended to ensure evaporation of part of the solvent of diol type, and when applicable part of the dilution solvent and optionally secondary products such as esters resulting from reactions between the metal precursors. After this operation, the deposited sol-gel solution is fully converted to a gel layer of generally constant thickness adhering to the surface of the substrate. Efficient time and temperature to ensure gelling can easily be determined by skilled persons using IR spectrometry techniques for example.

For example, the drying operation of the invention can be conducted at a temperature lower than 100° C., e.g. at 50° C. for a time ranging from 1 to 10 minutes, using a hot plate for example.

After drying, each layer undergoes a calcining operation conducted at a temperature and for a time required to remove organic compounds from the deposited layer, in particular the preparation and dilution solvents of the sol-gel solution and the compounds generated by reaction between the molecular precursors. Efficient time and temperature can easily be determined by skilled persons using techniques such as IR (Infra-red) spectroscopy or differential thermal analysis and thermogravimetric analysis (DTA-TGA).

Calcining time for a given temperature corresponds to a time allowing a constant layer thickness to be obtained. Layer thickness is controlled for example using profilometry techniques. The calcining operation is stopped when a layer of homogenous thickness is obtained free of organic compounds.

Preferably, this calcining operation is conducted at a temperature ranging from about 300 to about 380° C. and for a time ranging from about 30 seconds to about 20 minutes.

For the $n^{th}$ layer, the pre-annealing operation entails heating to a temperature of up to 600° C., for a time possibly ranging from 1 minute to 60 minutes, preferably for a time longer than 15 minutes e.g. longer than 20 minutes.

Finally, after the pre-annealing operation, heat treatment optionally comprises an annealing operation, as is conventional, conducted at efficient temperature and time to allow crystallization of the deposited layer or assembly of deposited layers. Crystallization of the layer corresponds to the obtaining of a layer having stabilised thickness and of crystallized structure, generally of perovskite type. Annealing time and temperature are selected to obtain this crystallization that can easily be verified via structural analysis such as X-ray diffraction analysis. Preferably, annealing is conducted at a temperature ranging from about 800 to about 1000° C. for a time of between about 30 seconds and about 1 hour. If the method comprises the depositing of several layers, the annealing operation is performed on the complete stack of layers, each of the first (n−1) layers of the stack having previously undergone a drying operation, a calcining operation.

For annealing, several techniques can be employed. Preferably annealing is performed for example via Rapid Thermal Annealing (RTA) or Rapid Thermal Process (RTP).

The steps of sol-gel solution deposition and heat treatment can be repeated one or more times until a material is obtained having the desired thickness.

The material obtained is in the form of a layer or stack of dense layers not exhibiting any carbonate groups under infrared analysis, the removal of carbonate groups at the time of layer densification often inducing porosity in the layers in which they were present.

The invention is also directed towards a method for producing a powder of barium titanate doped with hafnium and/or with at least one lanthanide element, successively comprising the following steps:
- a step to implement the method for preparing a sol-gel solution such as defined above;
- a step to gel a sol-gel solution obtained with the method conforming to the invention; and
- a heat treatment step of the gel obtained, to obtain said powder.

The gelling step, as is conventional, is performed by adding water under agitation, resulting in hydrolysis-condensation reactions within the sol-gel solution leading to gelling thereof.

The gel thus obtained is subjected to heat treatment for conversion thereof to a powder of barium titanate doped with hafnium and/or with at least one lanthanide element, this heat treatment possibly comprising the following operations:
- a drying operation e.g. in a drying oven to remove at least part of the solvent trapped in the gel;
- after grinding the block resulting from drying of the gel, a calcining operation at efficient temperature to obtain removal of organic products and an annealing operation at efficient temperature to obtain crystallization of the barium titanate powder doped with hafnium and/or with at least one lanthanide element, advantageously in a perovskite crystalline system.

The powder obtained can be used to produce compacted objects in barium titanate doped with hafnium and/or with at least one lanthanide element, such as pellets, applying a method comprising the following steps:

a step to implement the method for preparing a powder such as defined above;

a step to compact the powder in a mould having a shape corresponding to that of the compacted object that it is desired to obtain;

a step to sinter the object obtained above for consolidation thereof.

More specifically, the compacting step can be performed by uniaxial pressing and can be conducted with the above-mentioned powder with which a binder has been mixed such as a polyvinyl alcohol.

The sintering step is conducted, as is conventional, at efficient time and temperature to obtain consolidation of the particles and optionally an increase in particle size. For example, when the sintering step is performed with pellets of barium titanate doped with hafnium and/or with at least one lanthanide element previously obtained by uniaxial pressing in the presence of a binder of polyvinyl alcohol type, the sintering step can be conducted at a temperature of at least 1300° C., preferably at least 1500° C., for a time of at least 5 hours.

Prior to the compacting step, the method may comprise a powder attrition step whereby the size of the constituent particles of the powder are reduced by friction.

In practice, this attrition step may consist of placing the powder in an attrition vessel in the presence of abrasive beads such as zirconium beads and a solvent to create a dispersion with the powder, this solvent possibly being an alcohol solvent such as ethanol. The resulting mixture in the attrition vessel is then subjected to agitation until the desired particle size is obtained.

It is to be noted that the reducing of powder particle size can contribute towards increasing the density of the compacted objects after sintering.

Finally, the invention relates to the preparation of a so-called composite sol-gel solution, comprising the following steps:

a step to implement the method for preparing a sol-gel solution such as defined above;

a step to add to said sol-gel solution a barium titanate powder doped with hafnium and/or with at least one lanthanide element, after which a dispersion is obtained in which the powder forms the dispersion phase, whilst the sol-gel solution forms the continuous dispersion medium.

It is specified that by composite sol-gel solution it is also meant a dispersion comprising a powder of barium titanate doped with hafnium and/or with at least one lanthanide element, and a precursor barium titanate sol-gel solution doped with hafnium and/or with at least one lanthanide element.

Advantageously, the constituent oxide ceramic of the powder can have the same composition as the oxide ceramic resulting from heat treatment of the sol-gel solution in which the powder was placed in dispersion.

The powder of the invention is a powder that can be commercially available or one that can be prepared beforehand and advantageously via sol-gel process from a sol-gel solution identical to the solution in which the powder is dispersed, this powder advantageously being prepared applying a method conforming to the invention and such as defined above.

The powders used in this invention advantageously have a mean particle diameter ranging from 10 nm to 10 μm.

Before incorporation thereof in the sol-gel solution mentioned above, they can be subjected to a grinding step e.g. via attrition to obtain finer particles.

According to the invention, the powder can be incorporated in the sol-gel solution in a content of possibly up to 80% by weight of the total weight of the dispersion, preferably in a content ranging from 10 to 60% by weight or 5 to 60% by weight.

This composite sol-gel solution can advantageously be used to produce a material in barium titanate doped with hafnium and/or with at least one lanthanide element, this material possibly being a thick coating on a substrate, this material able to be prepared with a preparation method successively comprising the following steps:

a) preparing a composite sol-gel solution with a method such as defined above;

b) depositing a layer of composite sol-gel solution such as defined above on a substrate via liquid process;

c) repeating b) one or more times to obtain a stack of at least two layers;

d) heat treating said layers for conversion thereof to the corresponding ceramic(s);

e) impregnating the stack obtained at c) with a sol-gel solution the same as or differing from the solution used at step a) but which is a precursor of a barium titanate ceramic doped with hafnium and/or with at least one lanthanide element;

f) optionally repeating step e) one or more times;

g) heat treating said stack for conversion of the sol-gel solution impregnating the stack to the corresponding ceramic.

With the method of the invention, it is possible to overcome a certain number of shortcomings in the prior art. The impregnation step with a sol-gel solution of the entirety of the stack and not layer-by-layer contributes towards considerable simplification of prior art methods.

According to the invention, the method at a first stage comprises a step to deposit a layer of a composite sol-gel solution such as defined above on a substrate, the deposition techniques possibly being dip-coating, spin-coating, laminar-flow-coating or meniscus coating, spray-coating, doctor blade coating, ink jet deposit, with preference being given however to dip coating.

Dip coating allows excellent results to be obtained and notably allows deposition on substrates of complex shape.

The substrate on which the dispersion layer is deposited may be of different types.

Advantageously, this substrate must not contaminate the deposited layer through migration of ions for example at the time of heat treatment and must allow good adhesion of the layer. Advantageously its softening point must be higher than the temperature of the heat treatments of the deposited layers, and its coefficient of heat expansion must be compatible with that of said layers to limit the stress effects of heat treatments.

In particular, it can be selected from among substrates in stainless steel; in nickel-containing steel; in optionally metallised silicon; in aluminium; in ceramic such as zirconia (e.g. yttrium-doped zirconia or yttrium oxide), in hafnium-doped barium titanate (also known under the abbreviation BHT); in titanium; in carbon; in glass or a polymer.

In particular, if the substrates are metal-based such as substrates in steel, aluminium or titanium, it may be advantageous on the surface of the substrate (acting as support for deposition of the dispersion layer) to deposit a dense layer of an oxide selected for example from among $SiO_2$, $Ta_2O_5$, $ZrO_2$, $Al_2O_3$, $TiO_2$, PZT, BST and combinations thereof.

This layer will ensure the role of a barrier layer and will therefore, at the time of heat treatment, prevent the diffusion of atoms belonging to the substrate towards the stack of layers. This layer acting as barrier can be obtained by depositing on the substrate a precursor sol-gel solution of the constituent oxide ceramic(s) of this layer, the depositing of said sol-gel solution possibly being performed via one the liquid coating processes mentioned above.

The prepared dispersion is then deposited in a layer via a liquid coating process (as explained above) on a substrate such as defined above.

The choice of deposit rate is determined as a function of the desired layer thickness.

In general, the thickness of each deposited layer ranges from 1 to 50 µm, for example from 1 to 25 µm.

With regard to the dip coating technique, the substrate to be coated is dipped in the previously prepared dispersion and withdrawn at a predetermined rate. Rate of withdrawal is generally in the region of between 1 cm/min and 30 cm/min. Liquid coating processes such as spin coating, laminar flow coating or dip coating have the advantage of allowing precise control over the thickness of the deposited layers.

This deposition step is repeated one or more times to obtain a stack of at least two layers and possibly of up to 50 layers for example, preferably 2 to 10 layers. The number of repeats of this step is determined by those skilled in the art according to the desired stack thickness, the thickness of the stack possibly being greater than 1 µm and more specifically possibly ranging from 1 µm to 200 µm, preferably from 1 µm to 50 µm.

The method of the invention also comprises a ceramifying step via heat treatment of said layers i.e. a step to heat treat the above-mentioned dispersion for conversion of the sol-gel solution to the corresponding ceramic.

According to a first alternative, heat treatment can be implemented layer by layer. In this case, heat treatment generally successively comprises:
 a drying operation of the layer at a suitable temperature to obtain gelling thereof;
 a calcining operation at a suitable temperature to obtain removal of organic products included in the layer;
 an annealing operation at a suitable temperature to obtain crystallization of the layer to an oxide ceramic.

This heat treatment is repeated for each deposited layer i.e. as many times as there are deposited layers.

In the invention it is also possible to provide for finalisation of this heat treatment with an annealing operation of the entire stack.

According to a second alternative, heat treatment can be conducted as follows:
 a drying operation of each deposited layer;
 a calcining operation of each deposited layer;
 an annealing operation of all the n deposited layers, n ranging from 2 up to the total number of deposited layers.

Irrespective of the envisaged alternative, drying is generally conducted at a temperature lower than 100° C. This drying allows grouping of the precursors contained in the sol-gel solution and condensation thereof to form a gel. At the time of this condensation, organic products are released such as alcohols, carbonates. The calcining operation intended to remove organic products resulting from condensation of the molecular precursors is generally performed at temperature higher than 350° C., e.g. at a temperature of 360 to 400° C. for removal of organic products with creation of carbonates when applicable.

Finally, the annealing operation is generally conducted at a temperature higher than at least 750° C., preferably at least 800° C., further preferably of at least 900° C., for crystallization of the layers.

Once the stack is formed, the method of the invention provides for a step to impregnate the entire stack with a precursor sol-gel solution of a ceramic of barium titanate type doped with hafnium and/or with at least one lanthanide element (this sol-gel solution being free of powder) the same as or differing from the one used at the first step, this impregnation step being repeated one or more times. This precursor solution is of different or same type as the one used as continuous dispersion medium at the above-mentioned deposition step. Preferably, the impregnation sol-gel solution is obtained with the above-mentioned method of the invention, said sol-gel solution particularly allowing plugging of pores on the surface of the stack (without fully infiltrating the stack) and also impermeabilization of the surface of the stack. In this manner, the resulting stack can be used for piezoelectric applications.

This impregnation step can be repeated one or more times e.g. up to 10 times. For example, those skilled in the art are able to determine the number of impregnation steps to be conducted in order to obtain a surface condition that is as smooth as possible. For example, skilled persons can determine the number of impregnation steps needed to obtain a surface roughness of the stack, after these impregnations, that is divided by 2 for example compared with a non-impregnated stack, measurement of roughness being performed using a profilometer. These impregnation steps are carried out via liquid process using the above-mentioned techniques, preferably the dip-coating technique.

The stack thus impregnated is then heat treated to convert the precursor sol-gel solution impregnating the stack to the corresponding oxide ceramic.

According to a first alternative, heat treatment can be performed at the end of each impregnation step. In this case, it generally comprises a drying operation generally at a temperature lower than 100° C., generally followed by a calcining operation intended to remove organic products and optionally carbonates derived from conversion of the sol-gel solution to a gel, this operation generally being conducted at a temperature higher than 300° C., and/or finally by an annealing operation intended to crystallize the oxide ceramic, this operation generally being performed at a temperature higher than 600° C.

According to a second alternative, heat treatment may successively comprise:
 a drying operation at each impregnation;
 a calcining operation at each impregnation;
 an annealing operation of all the m impregnations, m ranging from 2 up to the total number of impregnations.

The stack resulting from this method is a thick coating (in particular having a thickness greater than 1 µm) having piezoelectric properties, which can be used to produce high frequency transducers for medical imaging.

As a variant, the composite sol-gel solution obtained with the method of the invention can be used directly, being formed via inkjet or machining into multiple-element arrays for example that will be integrated as transducers into high resolution ultrasound probes for medical imaging (such as ultrasound).

The invention will now be described in the light of the examples set forth below, these examples only being given to illustrate the invention and not in any manner limiting the invention.

DETAILED DESCRIPTION OF PARTICULAR EMBODIMENTS

Example 1

This example illustrates the preparation of pellets of barium titanate doped with hafnium, and more specifically meeting the formula $BaHf_{0.05}Ti_{0.95}O_3$, this preparation comprising the following steps:
- a step to prepare a precursor sol-gel solution of barium titanate having the above-mentioned formula (step a);
- a step to prepare a powder from the sol-gel solution resulting from step a) (step b);
- a step to prepare pellets from the powder obtained at step b) (step c).

a) Preparation of a Precursor Sol-Gel Solution of Barium Titanate of Formula $BaHf_{0.05}Ti_{0.95}O_3$ This step illustrates the preparation of a precursor sol-gel solution of barium titanate of formula $BaHf_{0.05}Ti_{0.95}O_3$ from the following alkoxide precursors: titanium isopropoxide symbolised $Ti(OiPr)_4$, hafnium isopropoxide symbolised $Hf(OiPr)_4$ and barium acetate symbolised $Ba(OAc)_2$.

In a first round-bottom flask, titanium isopropoxide (6.67 g; 0.0234 mole) and hafnium isopropoxide (0.9 g; 0.00217 mole) are respectively added to isopropanol (5 g; 0.083 mole). The whole is left under agitation for 1 hour for proper dispersion of the hafnium isopropoxide in solution.

In parallel, a second round-bottom flask surmounted by a distillation assembly is charged with barium acetate (6.48 g; 0.0255 mole)) in ethylene glycol (14.68 g; 0.236 mole) under agitation, to prevent the formation of an insoluble block. To the resulting mixture, the content of the first flask is added after the above-mentioned agitation operation. The whole is then distilled until the temperature of the reaction mixtures reaches 160° C. After distillation, the solution is opaque. It is found under infrared analysis that 90% by weight of the isopropanol has been removed and that esters have been formed.

Once the temperature has returned to 100° C., acetic acid (14 g; 0.23 mole) is slowly added to the distillate until total dissolution of the non-dissolved precursors and a clear yellow solution is obtained.

A substantial amount of water is added to the sol-gel solution under agitation to form a gel. The gel is then dried in an oven.

The powder collected from the oven is ground and calcined at 400° C. to remove residual organic components, sources of carbonation.

The powder obtained is again ground and annealed this time at 900° C., to obtain a powder of barium titanate doped with crystallized hafnium having a perovskite crystal structure.

The powder is then subjected to an attrition operation in an attrition drum containing 75 g of powder, 150 g of ethanol and 1600 g of zirconium beads, the resulting mixture being placed under agitation for 20 minutes at 1500 rpm. After this operation, a finer powder is recovered that can be used to form pellets the density of which will be greater after sintering, compared with pellets produced with non-attrited powders.

The pellets are produced using a uniaxial press. A binder (more specifically polyvinyl alcohol) is added to the powder and the resulting mixture is placed in a 16 mm mould and pressed at 20 MPa. The formed pellets are then sintered at 1500° C. for 5 hours.

Characterization of these pellets is performed by impedance measurement after polarising the pellets in an oil bath subjected to an electric field (150° C.; 2 kV/mm).

The piezoelectric properties obtained are of particular interest notably having a $k_t$ value (corresponding to the coupling constant in thickness mode, which approximately corresponds to the ratio between supplied mechanical energy and received mechanical energy) of 0.47 and a dielectric constant of 840 (at 1.8 MHz).

Example 2

This example illustrates the preparation of pellets in barium titanate doped with hafnium, and more specifically meeting formula $BaHf_{0.1}Ti_{0.9}O_3$, the preparation following similar modalities to those in Example 1 except in respect of the quantities of reagents which are the following:
- Barium acetate: 6.48 g;
- Titanium isopropoxide: 6.49 g;
- Hafnium isopropoxide: 1.2 g;
- Ethylene glycol: 14.68 g;
- Isopropanol: 5 g; and
- Acetic acid: 14 g.

In addition, the pellets are sintered at a temperature of 1350° C. from powders that have not been subjected to attrition treatment.

These pellets have a dielectric constant of 1230.

Example 3

This example illustrates the preparation of a precursor sol-gel solution of barium titanate doped with hafnium of formula $BaHf_{0.075}Ti_{0.925}O_3$, the preparation being carried out following similar modalities to those in Example 1 except in respect of the quantities of reagents which are the following:
- Barium acetate: 6.48 g;
- Titanium isopropoxide: 6.67 g;
- Hafnium isopropoxide: 0.90 g;
- Ethylene glycol: 14.68 g;
- Isopropanol: 5 g; and
- Acetic acid: 14 g.

Example 4

This example illustrates the preparation of a material in the form of a thin layer from sol-gel solutions prepared as in Examples 1, 2 and 3, and all aged for 45 days and each having a concentration of 0.9 M.

Before deposition, the sol-gel solution is diluted with ethylene glycol (40 mL) in particular to adapt the wettability and viscosity of the solution to the substrate and to deposition conditions, the substrate in this example being a portion of a platinum-silicon wafer (Si 500 μm/$SiO_2$ 2.5 μm/Ti 15 nm/Pt 150 nm) and the deposition technique used in this example being spin coating.

The sol-gel solution thus diluted is deposited via spin coating for 3 minutes at 3000 rpm and then dried over a hot plate first for 5 minutes at 50° C. and then 10 minutes at 360° C. Several layers (total of 3) are stacked following the same treatment and the resulting stack is heat treated at 600° C. over a hot plate followed by oven annealing (Rapid Thermal Annealing—RTA) for 1 minute at 750° C. The coating obtained does not exhibit any carbonate groups under infrared analysis, indicating the strong density of the coating obtained.

The coating obtained also displays strong permittivity at 1 kHz, of respectively 200 for a film derived from the sol-gel solution in Example 1 (e=180 nm), 231 for a film derived from the sol-gel solution in Example 3 (e=500 nm), 215 for a film derived from the sol-gel solution in Example 2 (e=400 nm), this being of possible particular interest in the field of microelectronics.

Example 5

The solution in Example 1 is aged for 45 days and then diluted with ethylene glycol to obtain a solution of 0.4 M concentration. This is obtained by adding 12 mL of ethylene glycol to 10 ml of the aged solution. 50 grams of this solution are mixed with 5.5 grams of barium titanate powder doped with hafnium prepared following the protocol in Example 1. The composite solution is left under agitation for 40 days. Stack deposition is then performed by dip coating at a rate of 5 cm/min (5 layers). Heat treatment at 600° C. (5 minutes) over a hot plate is conducted for each layer. Final annealing is carried out at 900° C. (2 minutes), in an RTA oven on the entire stack.

The films are then impregnated with a non-loaded sol of 0.5 M concentration. Heat treatment is applied at 600° C., over a hot plate for 1 hour for each impregnation layer. Final annealing in an RTA oven at 900° C. is then carried out for 2 minutes.

Aluminium electrodes are placed on the composite layer of 45 μm thickness for electromechanical characterization. The measured coupling coefficient is 0.45 i.e. close to that of the bulk material.

The invention claimed is:

1. A method for preparing a sol-gel solution which can be used to prepare a barium titanate ceramic doped with hafnium and/or with at least one lanthanide element, comprising the following steps:
    a) a step to place a first mixture comprising a barium carboxylate and a diol solvent in contact with a second mixture comprising a titanium alkoxide and a hafnium alkoxide and/or an alkoxide of a lanthanide element in a monoalcohol solvent;
    b) a step to distill the mixture resulting from step a) to remove at least part of the monoalcohol solvent; and
    c) a step to add acetic acid, under heat, to the distilled mixture of step b).

2. The method according to claim 1, wherein the prepared sol-gel solution is used to prepare a barium titanate ceramic doped solely with hafnium, wherein the second mixture comprises a titanium alkoxide and a hafnium alkoxide.

3. The method according to claim 1, wherein the barium carboxylate is represented by following formula (II)

$$(RCOO)_2Ba \qquad (II)$$

where R is an alkyl group having 1 to 3 carbon atoms.

4. The method according to claim 1, wherein the barium carboxylate is barium acetate of formula $(CH_3COO)_2Ba$.

5. The method according to claim 1, wherein the diol solvent is an alkylene glycol having a number of carbon atoms ranging from 2 to 5.

6. The method according to claim 1, wherein the hafnium alkoxide and/or lanthanide element alkoxide and titanium alkoxide contained in the second mixture respectively meet following formulas (II) and (III):

$$X(OR)_4 \qquad (II)$$

$$Ti(OR)_4 \qquad (III)$$

where:
    X is the hafnium element or lanthanide element; and
    R is a linear or branched alkyl group, wherein the branched alkyl group has at least 3 carbon atoms.

7. The method according to claim 6, wherein the monoalcohol solvent has the same number of carbon atoms as each alkoxy ligand (RO) of the alkoxides of formulas (II) and (III) defined in claim 6.

8. The method according to claim 1, wherein the second mixture is a mixture comprising, as hafnium alkoxide, hafnium isopropoxide, and, as titanium alkoxide, titanium isopropoxide.

9. The method according to claim 1, wherein the monoalcohol solvent is an aliphatic monoalcohol solvent having 1 to 6 carbon atoms.

10. The method according to claim 1, when the prepared sol-gel solution may be used to prepare a barium titanate ceramic doped with hafnium, the prepared barium titanate ceramic doped with hafnium meets following formula (IV):

$$BaHf_xTi_{1-x}O_3 \qquad (IV)$$

where $0.05 \leq x \leq 0.2$.

11. The method according to claim 1, which, after step c), further comprises the following steps:
    d) a step to agitate the sol-gel solution obtained at step c); and
    e) a step to dilute the sol-gel solution resulting from step d) in a predetermined ratio with a diol solvent the same as the one used at step a).

12. A method for producing a material, which is barium titanate doped with hafnium and/or with at least one lanthanide element, said method comprising:
    f) a step to implement the method defined in claim 1;
    g) at least one step to deposit on a substrate a layer of sol-gel solution obtained at step f); and
    h) a heat treatment step of said layer for conversion thereof to barium titanate doped with hafnium and/or with at least one lanthanide element.

13. A method for producing a powder of barium titanate doped with hafnium and/or with at least one lanthanide element, successively comprising the following steps:
    a step to implement the method defined in claim 1;
    a gelling step of a sol-gel solution obtained at the preceding step; and
    a heat treatment step of the resulting gel to obtain said powder.

14. A method for producing a compacted object made in barium titanate doped with hafnium, successively comprising the following steps:
    a step to implement the method for preparing a powder defined in claim 13;
    a step to compact the powder in a mould having a shape corresponding to that of the compacted object it is desired to obtain; and
    a step to sinter the object obtained above for consolidation thereof.

15. A method for preparing a composite sol-gel solution, comprising the following steps:
    a step to implement the method for preparing a sol-gel solution defined in claim 1;
    a step to add to said sol-gel solution a powder of barium titanate doped with hafnium and/or with at least one lanthanide element, after which the composite sol-gel solution is obtained consisting of a dispersion in which the powder forms a dispersion phase whilst the sol-gel solution forms a continuous dispersion medium.

16. A method for preparing a material which is barium titanate doped with hafnium and/or with at least one lanthanide element, successively comprising the following steps:
  a) preparing a composite sol-gel solution with a method defined in claim 15;
  b) depositing a layer of the composite sol-gel solution via liquid process on a substrate;
  c) repeating b) one or more times to obtain a stack of at least two layers;
  d) heat treating said layers for conversion thereof to ceramic(s);
  e) impregnating the stack obtained at d) with a sol-gel solution the same as or differing from that used at a), said sol-gel solution being a precursor of a barium titanate ceramic doped with hafnium and/or with at least one lanthanide element;
  f) optionally repeating step e) one or more times;
  g) heat treating said stack to convert the sol-gel solution impregnating the stack to ceramic.

* * * * *